United States Patent
Patel et al.

(10) Patent No.: US 9,600,398 B2
(45) Date of Patent: Mar. 21, 2017

(54) METHOD AND APPARATUS FOR DEBUGGING HDL DESIGN CODE AND TEST PROGRAM CODE

(71) Applicant: Synopsys, Inc., Mountain View, CA (US)

(72) Inventors: Bindesh Patel, San Diego, CA (US); I-Liang Lin, Zhubei (TW); Ming-Hui Hsieh, Miaoli County (TW); Jien-Shen Tsai, Taipei (TW)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 14/527,298

(22) Filed: Oct. 29, 2014

(65) Prior Publication Data

US 2015/0121346 A1   Apr. 30, 2015

Related U.S. Application Data

(60) Provisional application No. 61/897,194, filed on Oct. 29, 2013.

(51) Int. Cl.
   *G06F 9/44*  (2006.01)
   *G06F 11/36*  (2006.01)
   *G06F 17/50*  (2006.01)

(52) U.S. Cl.
   CPC ...... *G06F 11/3664* (2013.01); *G06F 11/3612* (2013.01); *G06F 17/5022* (2013.01); *G06F 17/5045* (2013.01)

(58) Field of Classification Search
   CPC ............ G06F 11/3664; G06F 17/5022; G06F 11/3612; G06F 17/5045
   USPC .................................................. 717/124-135
   See application file for complete search history.

(56) References Cited

U.S. PATENT DOCUMENTS

| | | | |
|---|---|---|---|
| 6,087,967 A * | 7/2000 | Budnik et al. ................. | 341/63 |
| 6,904,577 B2 * | 6/2005 | Schubert et al. ............. | 716/103 |
| 7,711,535 B1 * | 5/2010 | Brookes et al. ............... | 703/14 |

OTHER PUBLICATIONS

Altera, "Simulating Nios II Embedded Processor Designs", 2004, retrieved from http://www.ee.ryerson.ca/~courses/coe718/Data-Sheets/Nios-Lab/an351.pdf, 18 pages.*
Xilinx, "ISim User Guide", Apr. 2012, Xilinx, Inc., 156 pages.*

* cited by examiner

*Primary Examiner* — Ted T Vo
(74) *Attorney, Agent, or Firm* — Alston & Bird LLP

(57) ABSTRACT

Disclosed is a method of debugging a simulation system including design code representing a design of an electronic circuit and test program code configured to exercise the design code. The method includes using an interactive debugging tool to execute an interactive simulation of the test program code and the design code, and, during the interactive simulation, displaying, using the interactive debugging tool, information of a simulation results file storing a plurality of signal values generated by executing the test program code and the design code during a previously executed simulation.

14 Claims, 6 Drawing Sheets

METHOD AND APPARATUS FOR DEBUGGING HDL DESIGN CODE AND TEST PROGRAM CODE

REFERENCES TO RELATED APPLICATIONS

This application claims benefit under 35 USC 119(e) of U.S. provisional Application No. 61/897,194, filed on Oct. 29, 2013, the contents of all of which are incorporated herein by reference in their entirety.

FIELD OF THE INVENTION

The present disclosure relates generally to debugging programs and more specifically to debugging hardware description language design code and test program code.

BACKGROUND OF THE INVENTION

Integrated circuit (IC) designers commonly describe their electronic circuit designs in HDL (hardware description language) such as Verilog, VHDL, SystemC, etc. VHDL stands for VHSIC (very high speed integrated circuits) hardware description language. Designs are usually simulated with test programs. When the simulation results are not as desired, debugging may be performed to find the errors. Generally, the errors may exist either in the design code or in the test program code.

To debug the design code, simulation tools typically store signal values during the simulation in a file that may be referred to as a 'dump file'. Using the dump file, users, such as designers, usually have a good chance to locate and fix the errors in the design code. However, if the errors are in the test program, the signal values that are stored in the dump file may not sufficient, for example, because the dump file generally includes data sampled once for every clock cycle of the synchronous simulation. Test programs, however, are asynchronous, and often include variables that change value, for example, multiple times while the clock cycle of the simulation time stays unchanged. This may occur, for example, if the test program is performing calculations to determine what signals to provide the design code during a next simulation clock cycle. In addition, test programs can create or delete variables dynamically. As a result of these software behaviors in the test programs, traditional synchronous dump-file-based debugging may not be very useful for debugging test programs.

Consequently, interactive debugging (analogous to running "gdb" for software debugging) is typically used for debugging test programs. During interactive debugging, a simulation is run, during which, like non-interactive simulations, the test program code is executed such that the design code is exercised and tested. In addition, unlike non-interactive simulations, during interactive debugging, the test program code may be temporarily suspended, for example, using breakpoints. While suspended, the user may, for example, query or change variable information from the test program code and may query or change signal information from the design code.

There are times when users are not sure if an error is in the design code or in the test program code. Therefore, during interactive debugging, users may also cause the simulator to dump signal value changes into a file. This enables the designers to simultaneously debug the test program code and the design code. Unfortunately, dumping values in the file can dramatically slow down the simulator, can be in a cumbersome format, and may require unreasonable amounts of data. So the designers are constantly caught in a dilemma: should they bear with the slowness and cause interactive simulation to store information corresponding to a large number of variables and signals in a file so that in case the error is in the design code, there are enough stored data for debugging; or should they seek low simulation time and cause the interactive simulation to store little variable and signal information and accept the risk of not having enough data for debugging, for example, if the error is in the test program code?

What is needed is a method for users to perform interactive debugging efficiently, without the need for storing excessive variable information of the test program and/or design. There is a need in the art for an efficient system and method for debugging hardware description language design code and test program code simultaneously.

SUMMARY OF THE INVENTION

One inventive aspect is a method of debugging a simulation system including design code representing a design of an electronic circuit and test program code configured to exercise the design code. The method includes using an interactive debugging tool to execute an interactive simulation of the test program code and the design code, and, during the interactive simulation, displaying, using the interactive debugging tool, information of a simulation results file storing a plurality of signal values generated by executing the test program code and the design code during a previously executed simulation.

Another inventive aspect is a computer system adapted to debug a simulation system including design code representing a design of an electronic circuit and test program code configured to exercise the design code. The computer system is configured to use an interactive debugging tool to execute an interactive simulation of the test program code and the design code, and during the interactive simulation, to display, using the interactive debugging tool, information of a simulation results file storing a plurality of signal values generated by executing the test program code and the design code during a previously executed simulation.

Another inventive aspect is a computer readable medium including instructions, which, when executed, cause a computer to perform a method of debugging a simulation system including design code representing a design of an electronic circuit and test program code configured to exercise the design code The method includes using an interactive debugging tool to execute an interactive simulation of the test program code and the design code, and, during the interactive simulation, displaying, using the interactive debugging tool, information of a simulation results file storing a plurality of signal values generated by executing the test program code and the design code during a previously executed simulation.

BRIEF DESCRIPTION OF THE DRAWINGS

The accompanying drawings, which are incorporated in and constitute a part of this specification, illustrate implementations of inventive concepts and, together with the description, serve to explain various advantages and principles of the invention.

DETAILED DESCRIPTION OF THE INVENTION

Figure 1:
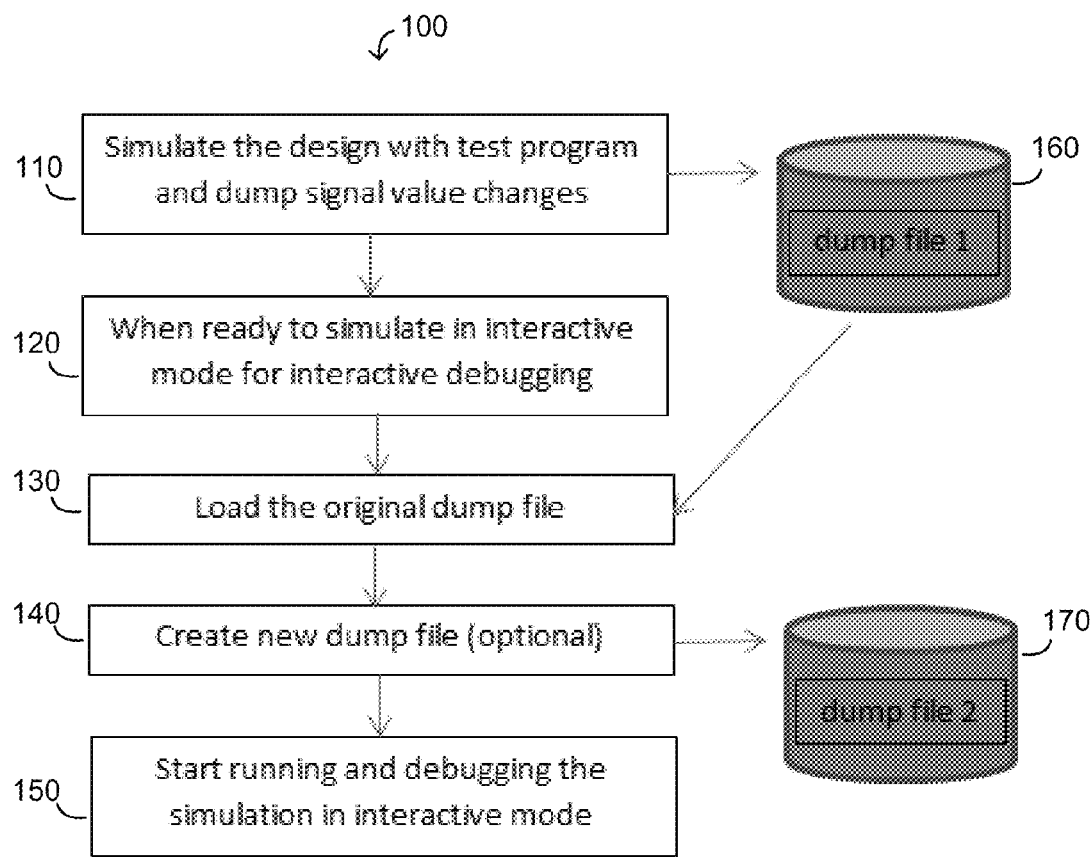
FIG. 1 illustrates an example high level flow diagram for merging post-processing and interactive files, in accordance with certain embodiments of the present disclosure.

For the purposes of explanation, the ensuing details are set forth in order to provide a thorough understanding of various embodiments. It will be apparent, however, to one skilled in the art that various embodiments may be practiced without some of these specific details. For example, circuits, systems, networks, processes, and other components may be shown as components in block diagram form in order not to obscure the embodiments in unnecessary detail. In other instances, known circuits, processes, algorithms, structures, and techniques may be shown without unnecessary detail in order to avoid obscuring the embodiments. In other instances, well-known structures and devices are shown in block diagram form.

Embodiments provided herein are examples only, and are not intended to limit the scope, applicability, or configuration of the disclosure. Rather, the ensuing description of the embodiments will provide those skilled in the art with an enabling description for implementing one or more embodiments. It should be understood that various changes may be made in the function and arrangement of elements without departing from the spirit and scope of the disclosed systems and methods as set forth in the appended claims.

Also, individual embodiments may, for example, be described as one or more processes which are depicted as flowcharts, flow diagrams, data flow diagrams, structured diagrams, or block diagrams. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine-readable medium. A processor(s) may perform the necessary tasks.

Certain embodiments interactively debug design code, such as hardware description language design code and test program code. In one embodiment, the test code and the design code are concurrently executed to simulate the design represented by the design code. Values for different signals generated by the design code and the test program code at different simulation times are stored in a reference file. Some embodiments provide an interactive debugging tool which accesses both the variable data of the test program code and the simulation data from the design code. In some embodiments, interactive debugging is carried out using a processor in a computer running a debugging tool program.

FIG. 1 illustrates an example of a flow diagram of a method 100, according to some embodiments. As illustrated, at 110, a simulation of the design is run using the test program code and the design code. The test program code, for example, provides inputs to the design code representing the design. In some embodiments, the test program code receives one or more outputs from the design code. In some embodiments, the test program code refers to a vector file for determining inputs and outputs. In some embodiments, the test program code compares outputs of the design with expected outputs to determine whether or not the design is functioning as desired.

In some embodiments, the simulation of 110 is not an interactive simulation. Instead, the simulation is initiated and continues to its end without suspension or interaction from the user with regard to debugging actions. The purpose of a non-interactive simulation is to ensure that the design (functions) simulates as expected under the influence of the test program used. A non-interactive simulation may or may not be directed by the user to create a dump file for subsequent debugging. The purpose of an interactive simulation is for debugging during the simulation.

During the simulation, signals related to the input, the output, and internal data of design code may be stored in a simulation dump file 160. For example, the simulation dump file 160 may store all input, output, and internal signals of the design code. Alternatively, in some embodiments, prior to running the simulation, the user specifies which signals to store in the dump file during the simulation.

Once the simulation has completed, the simulation may indicate that the design has not performed as desired. In some situations, the design code has errors such that the design code does not properly represent the desired functionality of the design. In some situations, the test program code does not properly represent the functionality desired thereof. To determine which code and which portions of which code are to be corrected, at 120, the user debugs both the test program code and the design code using, for example, an interactive debugging tool. For example, the user may use the interactive debugging tool to execute an interactive debugging simulation.

In response to an indication from the user, at 130, the interactive debugging tool loads the dump file 160 generated at 110. Additionally, in response to an indication from the user, the interactive debugging tool runs an interactive debugging simulation.

During the interactive debugging simulation, at 140, the interactive debugging tool may optionally use an additional dump file 170 for storing design code signals generated during the interactive debugging simulation.

At 150, the interactive debugging tool simulates the design code in the interactive debugging mode. For example, breakpoints may be set to suspend the simulation so that the user may query or change variable information from the test program code and may query or change signal information from the design code. Conditions for activating the breakpoints may, for example, be conditions on either or both of the test program code variables and the design code signals.

As indicated by the user, the interactive debugging tool generates an additional dump file 170 for storing design code signals during the interactive debugging simulation. Accordingly, while the interactive debugging simulation is suspended, for example, as a result of a breakpoint condition being met, design code signal information is available from both the dump file 160 generated during the simulation executed at 110 and from the additional dump file 170 generated during the interactive debugging simulation.

In some circumstances, a user may desire information of a particular signal which is available from either dump file 160 or additional dump file 170. In some embodiments, the user may indicate which dump file to access for the desired information. In some embodiments, the interactive debugging tool automatically determines which dump file to access.

Figure 2:
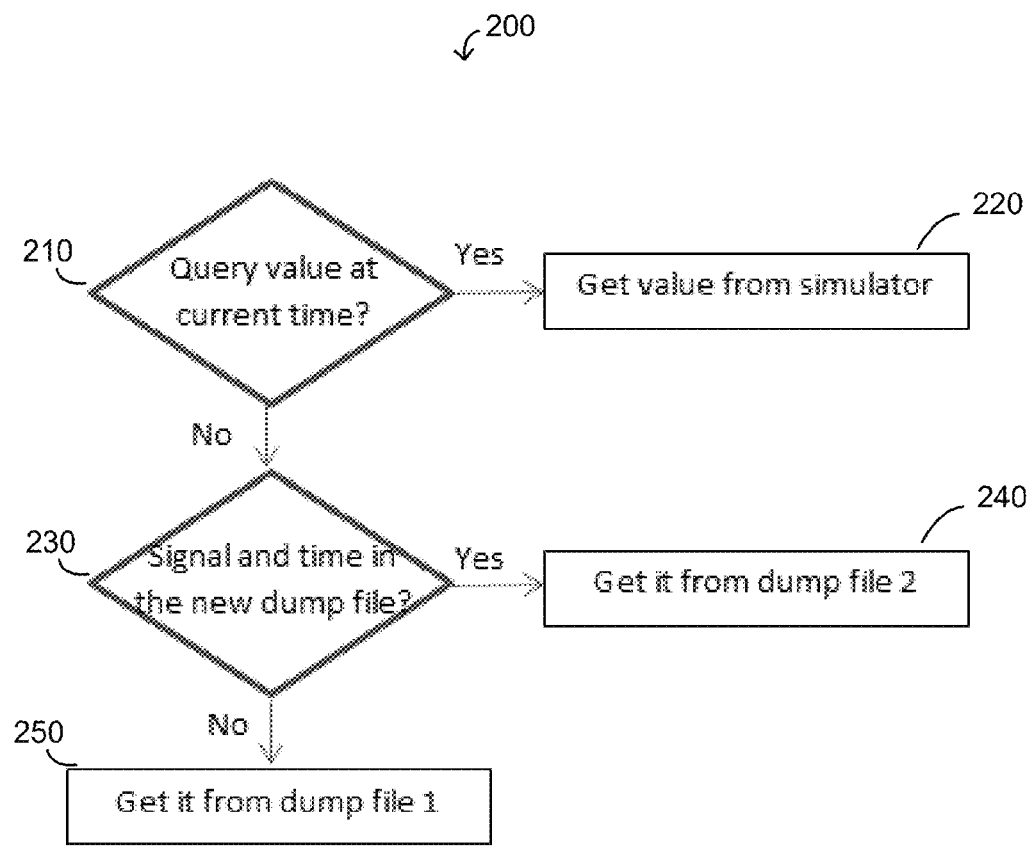
FIG. 2 illustrates an example flow diagram for retrieving signal values from different files, in accordance with certain embodiments of the present disclosure.

FIG. 2 illustrates an example flow diagram of a method 200 for retrieving requested signal values from the different dump files 160 and 170, in accordance with certain embodiments of the present disclosure. At 210, the interactive debugging tool determines whether the requested signal value is from the current simulation time of the suspended interactive debugging simulation. If the requested signal value is from the current simulation time, at 220, the interactive debugging tool queries the simulator memory for the requested signal values. For example, in a typical interactive debug session, the user may create a "watch" window that shows the current values of signals of interest. When the simulation is suspended, values in the watch window may be updated to indicate the current values of the signals of interest. In some embodiments, the watch window also indicates values of one or more test program code variables.

If the requested signal value is not from the current simulation time, at 230, the debugging tool determines whether the requested signal value is available from the additional dump file 170. If the requested signal value is available from the additional dump file 170, at 240, regardless of whether the requested signal value is available from the dump file 160, the interactive debugging tool automatically retrieves the requested signal value from the additional dump file 170. In some embodiments, at 230 or 240, the interactive debugging tool determines whether the requested signal value is stored in the additional dump file 170 prior to attempting its retrieval.

In alternative embodiments, the debugging tool automatically determines to retrieve the requested signal value from the dump file 160 regardless of whether the requested signal value is available from additional dump file 170. For example, multiple signal values may be requested, where one or more of the signal values is available only from dump file 160. In such circumstances, the debugging tool may retrieve all of the requested signal values from dump file 160.

If a requested signal value is not available from the additional file 170, at 250, the interactive debugging tool retrieves the requested signal value from the dump file 160. In some embodiments, at 230 or 250, the interactive debugging tool determines whether the requested signal value is stored dump file 160 prior to attempting its retrieval.

In some embodiments, at 230, to determine whether the requested signal value may be available from the additional dump file 170, the debugging tool determines whether the simulation time of the requested signal value is prior to or after the current simulation time of the suspended interactive debugging simulation. If the simulation time of the requested signal value is after the current simulation time, the debugging tool determines that the requested signal value is not available from the additional dump file 170. If the simulation time of the requested signal value is prior to the current simulation time, the debugging tool determines that the requested signal value may be available from the additional dump file 170.

In some embodiments, at 230, to determine whether the requested signal value may be available from the dump file 160, the debugging tool determines whether the simulation time of the requested signal value is prior to or after the greatest simulation time of the dump file 160. If the simulation time of the requested signal value is after the greatest simulation time, the debugging tool determines that the requested signal value is not available from the dump file 160. If the simulation time of the requested signal value is prior to the greatest simulation time, the debugging told the requested signal value may be available from the dump file 160.

In a typical interactive debug session, a waveform viewer is frequently used to show signal values in a waveform view. Signal values before the current simulation time can exist either in the additional dump file 170 or in the original dump file 160. Signal values beyond the current simulation time of the interactive debugging simulation can only exist in the original dump file 160, as the current interactive debugging simulation has progressed only to the point of the current simulation time. In some embodiments, the flow shown in FIG. 2 can be used to retrieve signal values for display in a waveform window.

In the method 200 of FIG. 2, the simulator, the original dump file 160, and the additional dump file 170 are each sources of signal and/or variable values which may be retrieved in response to a request. In the method 200, of the three sources, the simulator is preferred over the other sources, and the additional dump file 170 is preferred over the original dump file 160. In some embodiments, the simulator is preferred over the other sources, and the original dump file 160 is preferred over the additional dump file 170. In some embodiments, the additional dump file 170 is preferred over the other sources, and the simulator is preferred over the original dump file 160. In some embodiments, the additional dump file 170 is preferred over the other sources, and the original dump file 160 is preferred over the simulator. In some embodiments, the original dump file 160 is preferred over the other sources, and the simulator is preferred over the additional dump file 170. In some embodiments, the original dump file 160 is preferred over the other sources, and the additional dump file 170 is preferred over the simulator.

Figure 3:
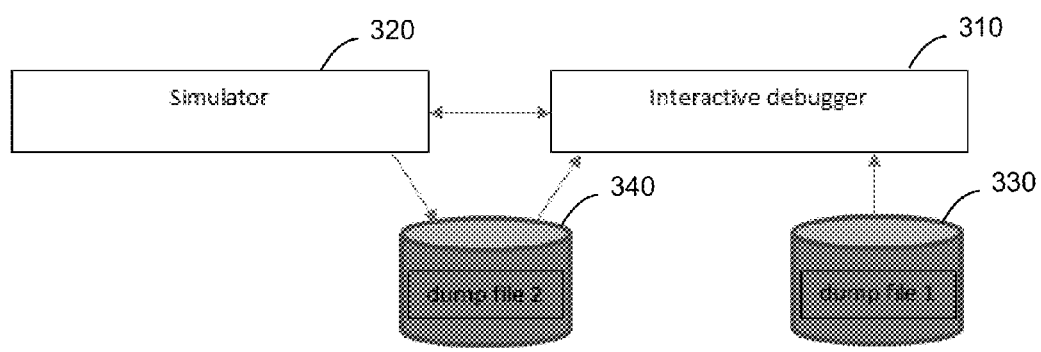
FIG. 3 illustrates an example relationship between a simulator and a debugger, in accordance with certain embodiments of the present disclosure.

FIG. 3 illustrates an example relationship between the interactive debugging tool 300 and the simulator 320, which is a software tool used to perform the interactive simulation during the interactive debugging. The simulator 320 may also have been used for the simulation 110 of FIG. 1. In some embodiments, an alternative simulator may have been used for the simulation 110 of FIG. 1.

In general, according to the user's request, the interactive debugging tool 300 sends simulator control and query commands to the simulator 320 and receives responses from the simulator 320. Values for signals at the current simulation time are or will be obtained in response to such query commands. In one embodiment, a dump file 330, such as dump file 160, is loaded by the debugger 310 before the interactive debugging simulation starts. As discussed above, values for the signals stored in the dump file 330 for simulation times before or after the current simulation time can be read from the dump file 330. Dump file 2 may be optional. According to user input, the debugging tool 310 optionally stores additional signal values during interactive debugging in a second dump file 340.

Figure 4:
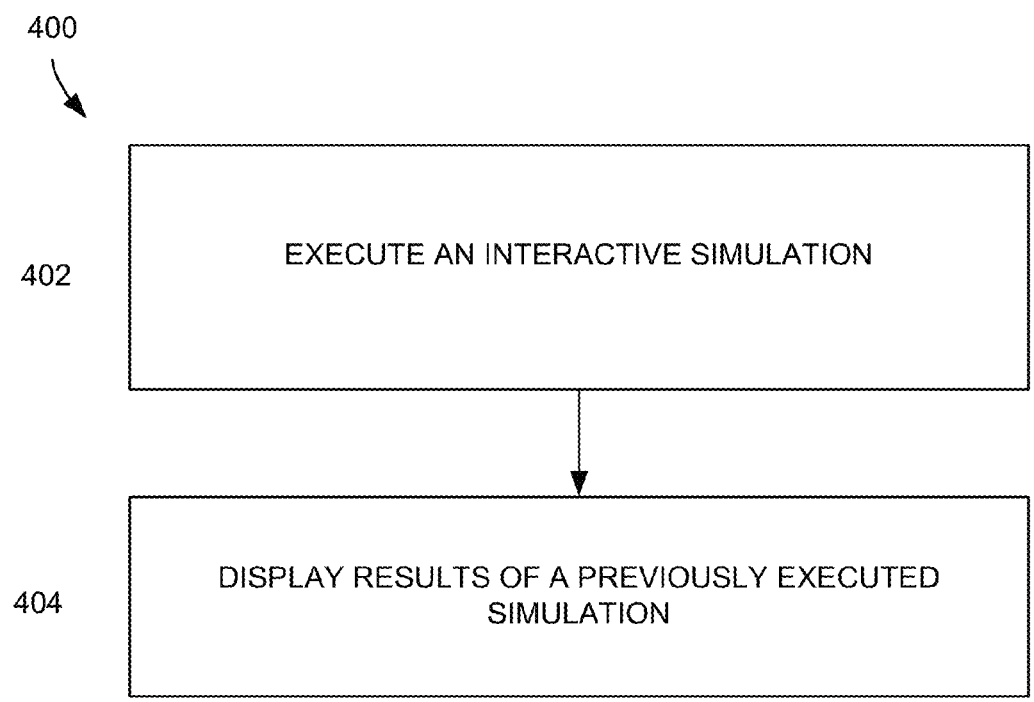
FIG. 4 illustrates example operations that may be performed by a device for interactive debugging, in accordance with certain embodiments of the present disclosure.

FIG. 4 illustrates an embodiment of a method 400, which includes example operations that may be performed by a device for interactive debugging, in accordance with certain embodiments of the present disclosure.

At 402, an interactive simulation is executed. The interactive simulation may allow, for example, setting of breakpoints with conditions which, when satisfied, cause the simulation to be suspended so that the state of the simulation at the time of the suspension may be analyzed. While the interactive simulation is executed, a simulation results file recording, for example, design code signal values may be generated. Other aspects of the interactive simulation include one or more of those aspects discussed elsewhere herein with regard to interactive simulation.

During the execution of the interactive simulation, a breakpoint condition may be satisfied. As a result, execution of the simulation is suspended. During the suspension of the execution, the user may, for example, analyze the state of test program code variables and design code signal values as of the simulation time of the interactive simulation went suspended. In addition, the user may analyze the state of design code signal values prior to the suspension of the simulation by accessing the simulation results file generated as part of the interactive simulation. Furthermore, the user may analyze the state of design code signal values at simulation times which have not yet been simulated during the interactive simulation by accessing a simulation results file generated from another simulation. In addition, other actions discussed elsewhere herein may be additionally or alternatively taken while the simulation is suspended.

Figure 5:
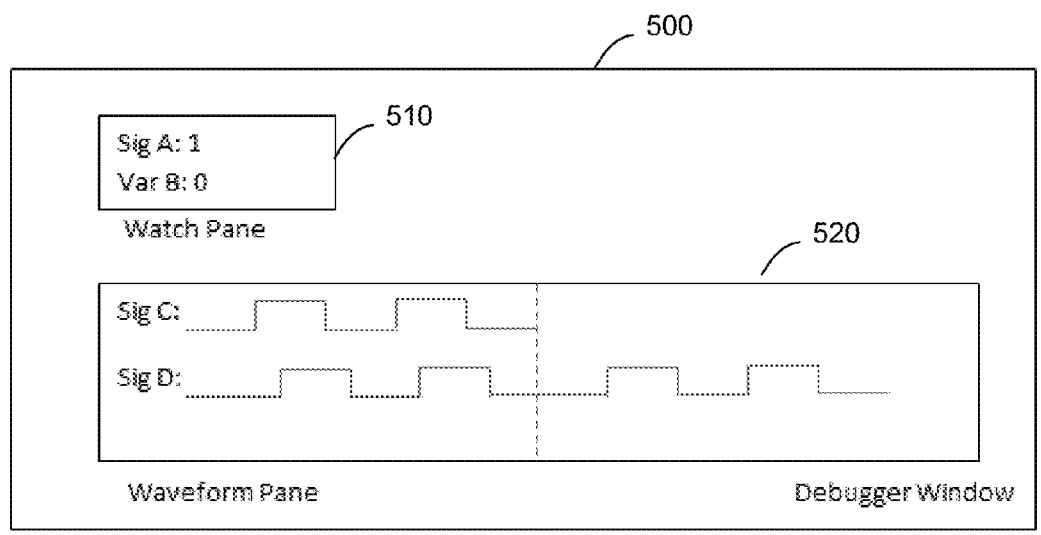
FIG. 5 illustrates an example debugger window display, in accordance with certain embodiments of the present disclosure.

FIG. 5 illustrates an example debugger window 500 that may be shown on a display of a device, according to some embodiments. The window 500 contains a watch pane 510 displaying current values of certain design code signals and test program code variables, and a waveform pane 520 displaying design code signal values with respect to simulation time. The values shown in the watch pane 510 can be obtained by querying a memory used by the debugging and simulation tool for executing the test program code during the interactive debugging simulation. The signal values in the waveform pane 520 may come from either a dump file being generated by current interactive debugging simulation or from a dump file previously generated by another simulation.

If signal values are read from the dump file of a previous simulation, they can be from simulation times before the current simulation time (shown as a vertical dash line in FIG. 5), and can be from simulation times after the current simulation time. However, if signal values are read from the dump file being generated by the current interactive debugging simulation, they can only be from the current simulation time or prior. Referring to FIG. 5, the waveform for "Sig C" is an example of a signal value retrieved from the dump file of the current interactive debugging simulation. In addition, the waveform for "Sig D" is an example of a signal value retrieved from the dump file of a previously run simulation.

It should be noted that without the dump file of the previously run simulation, the waveform pane (as illustrated in FIG. 5) can only show waveforms up to the current simulation time of the current interactive debugging simulation. With access to the information of the dump file of the previously run simulation, the waveform pane can show waveforms beyond the current simulation time (such as Sig D in FIG. 5). This can be interpreted as an ability to "look into the future".

The availability of future design code signal values proves to be very useful while debugging design and test program code. For example, the debugging tool can allow the user to examine signal values or properties in the dump file of the previously run simulation beyond the current simulation time to find a simulation time at which the design code generates signals indicating that the design is not properly functioning. A user can then determine, based on the examination of the information of the previous simulation, simulation time points to use as conditions associated with breakpoints for the interactive debugging simulation.

Without the availability of the information of the previously run simulation, to determine the cause of a simulation result indicating that the design code is improperly functioning, the user must run the simulation in a debugging mode with breakpoints set for times determined based on less precise information, for example, a guess. Once the debugging simulation reaches the time of such a breakpoint, the user then queries design code signal values and/or test program code variable values to determine whether the design code misfunction has occurred. If the design code misfunction has already occurred, the user determines a new simulation time for a new breakpoint, and reruns the simulation. If the design code misfunction has not yet occurred, the user may step through test program code instructions expecting, and hoping that the design code misfunction occurs soon. Because the appropriate simulation time for breakpoints is determined iteratively through trial and error, the process for determining breakpoints requires significant time.

With the availability of the information of the previously run simulation, to determine the cause of the simulation result indicating that the design code is improperly functioning, the user reviews the results of the previously run simulation from the dump file generated in the previously run simulation, determines a simulation time at which the design code first misfunctions, and sets a breakpoint based on the determined simulation time.

In some embodiments, the debugging tool allows the user to specify a conditional breakpoint, where the condition of the conditional breakpoint includes at least two sub-conditions. The first sub-condition may include a condition evaluated by the simulator. For example, the first sub-condition may be based on design code signal values. The second sub-condition may include a condition evaluated by the debugger. For example, the second sub-condition may be based on test program code variable values. Alternatively, the first sub-condition may be based on test program code variable values, and the second sub-condition may be based on test program code variable values.

In some embodiments, the debugging tool allows the user to specify a break point having a condition which is based on a simulation time in the future, with respect to the simulation time of the currently running simulation.

In response to the first sub-condition being met, the simulator may be suspended. During the suspension, the debugging tool may evaluate the second sub-condition, for example, by reading past or future values from a dump file. If the second sub-condition is also satisfied, then a breakpoint hit is indicated to the user. Otherwise, the simulator may be automatically resumed.

Figure 6:
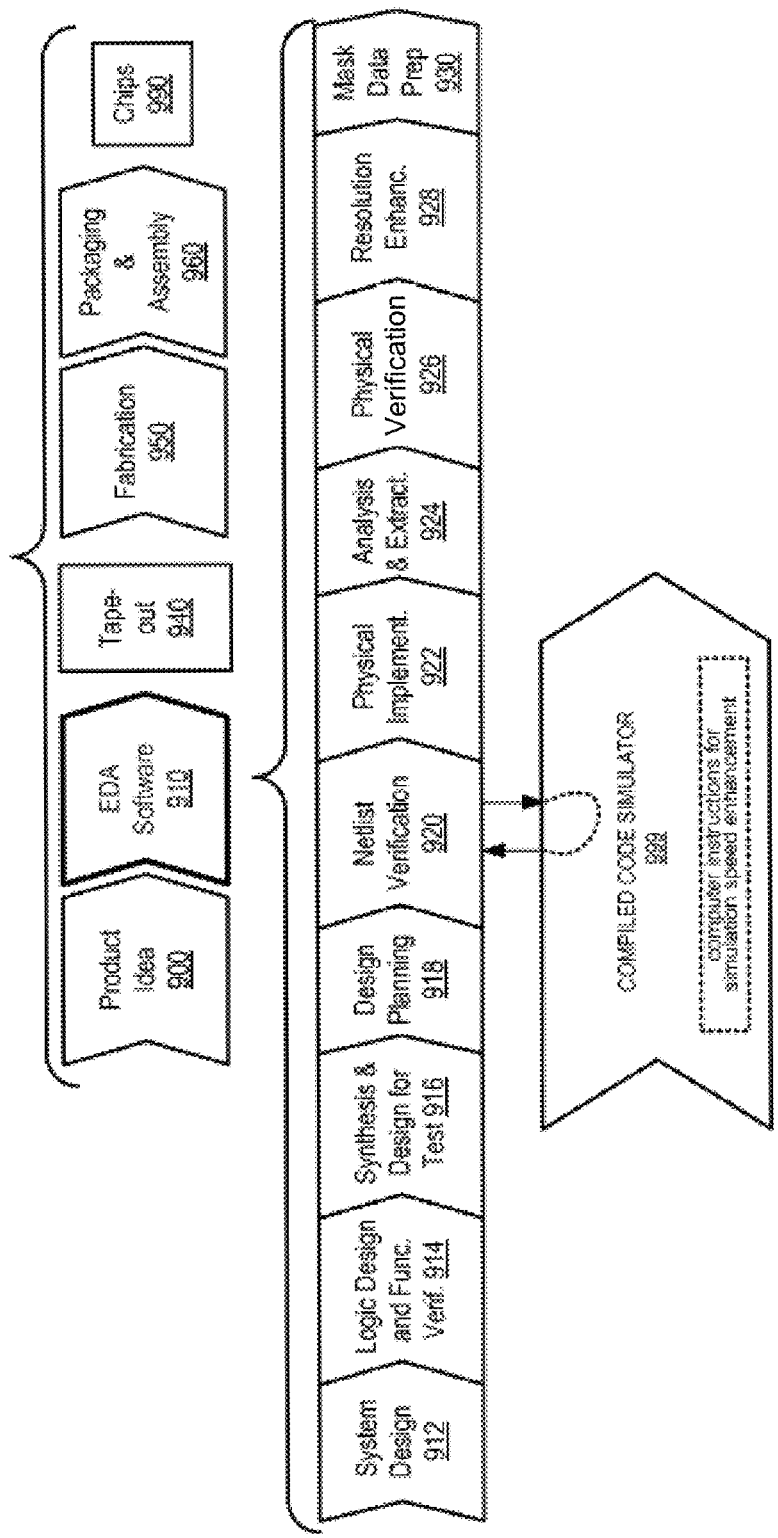
FIG. 6 illustrates a simplified representation of an exemplary digital Application Specific IC (ASIC) design flow in accordance with an embodiment of the invention.

An appropriately programmed computer (hereinafter "compiled code simulator") that performs actions described herein may be used in a digital ASIC design flow, which is illustrated in FIG. 6 in a simplified exemplary representation. At a high level, the process of designing a chip starts with the product idea (900) and is realized in an EDA software design process (910). When the design is finalized, it can be taped-out (event 940). After tape out, fabrication process (950) and packaging and assembly processes (960) occur resulting, ultimately, in finished chips (result 990).

The EDA software design process (910) includes a number of stages 912-930, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC. A brief description of the components of the EDA software design process (stage 910) will now be provided.

System design (stage 912): The circuit designers describe the functionality that they want to implement, they can perform what-if planning to refine functionality, check costs, etc. Hardware-software architecture partitioning can occur at this stage. Exemplary EDA software products from Synopsys®, Inc. that can be used at this stage include Model Architect, Saber, System Studio, and DesignWare® products.

Logic design and functional verification (stage 914): At this stage, the VHDL or Verilog code for modules in the system is written and the design (which may be of mixed clock domains) is checked for functional accuracy. Exemplary EDA software products from Synopsys®, Inc. that can be used at this stage include Verdi, VCS, VERA, DesignWare®, Magellan, Formality, ESP and LEDA products.

Synthesis and design for test (stage 916): Here, the VHDL/Verilog is translated to a netlist. The netlist can be optimized for the target technology. Additionally, the design and implementation of tests to permit checking of the finished chip occurs. Exemplary EDA software products from Synopsys®, Inc. that can be used at this stage include Design Compiler®, Physical Compiler, Test Compiler, Power Compiler, FPGA Compiler, Tetramax, and DesignWare® products.

Design planning (stage 918): Here, an overall floorplan for the chip is constructed and analyzed for timing and top-level routing. Exemplary EDA software products from Synopsys®, Inc. that can be used at this stage include Jupiter and Floorplan Compiler products.

Netlist verification (stage 920): At this step, the netlist is checked for compliance with timing constraints and for correspondence with the VHDL/Verilog source code. Exemplary EDA software products from Synopsys®, Inc. that can be used at this stage include VCS, VERA, Formality and PrimeTime products.

Note that a compiled code simulator 999 (of the type described above that performs the steps of methods described herein) can be used during this stage 920, as shown in FIG. 6. If the displayed results are not satisfactory, a chip designer may go back to stage 916 to make changes to the IC design.

Physical implementation (stage 922): The placement (positioning of circuit elements, such as the above-described sequential cells and combinational cells) and routing (connection of the same) occurs at this step. Exemplary EDA software products from Synopsys®, Inc. that can be used at this stage include the Astro product. Although circuitry and portions thereof (such as rectangles) may be thought of at this stage as if they exist in the real world, it is to be understood that at this stage only a layout exists in a computer 150. The actual circuitry in the real world is created after this stage as discussed below.

Analysis and extraction (stage 924): At this step, the circuit function is verified at a transistor level, this in turn permits what-if refinement. Exemplary EDA software products from Synopsys®, Inc. that can be used at this include Star RC/XT, Raphael, and Aurora products.

Physical verification (stage 926): At this stage various checking functions are performed to ensure correctness for: manufacturing, electrical issues, lithographic issues, and circuitry. Exemplary EDA software products from Synopsys®, Inc. that can be used at this stage include the Hercules product.

Resolution enhancement (stage 928): This involves geometric manipulations of the layout to improve manufacturability of the design. Exemplary EDA software products from Synopsys®, Inc. that can be used at this include iN-Phase, Proteus, and AFGen products.

Mask data preparation (stage 930): This provides the "tape-out" data for production of masks for lithographic use to produce finished chips. Exemplary EDA software products from Synopsys®, Inc. that can be used at this include the CATS(R) family of products. Actual circuitry in the real world is created after this stage, in a wafer fabrication facility (also called "fab").

The data structures and software code for implementing one or more acts described in this detailed description can be encoded into a computer-readable medium, which may be any storage medium and/or any transmission medium that can hold code and/or data for use by a computer. Storage medium includes, but is not limited to, magnetic and optical storage devices such as disk drives, magnetic tape, CDs (compact discs), and DVDs (digital versatile discs). Transmission medium (with or without a carrier wave upon which the signals are modulated) includes but is not limited to a wired or wireless communications network, such as the Internet. In one embodiment, the transmission medium uses a carrier wave that includes computer instruction signals for carrying out one or more steps performed by the methods discussed herein. Another embodiment uses a carrier wave that includes instructions to perform a method as discussed herein.

A computer system used in some embodiments to implement a simulation speed enhancer of the type described herein uses one or more linux® operating system workstations (based on IBM®-compatible PCs) and/or unix® operating systems workstations (e.g. SUN Ultrasparc, HP PA-RISC, or equivalent), each containing a 2 GHz CPU and 1 GB memory, that are interconnected via a local area network (Ethernet).

It should be noted that although the above interactive debugging tool is described referring to a single dump file of a previously run simulation, in general, any number of dump files may be generated during the first execution of the design code and the test program code and/or during the interactive debugging. In addition, multiple dump files, each generated from a different previously run simulation, may be used. Furthermore, signal values for any number of nodes in the design may be stored in each of the files.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code and instructions for implementing the debugging tool described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Computer-readable storage medium may include non-transitory type computer-readable storage medium. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The above descriptions of embodiments of the present invention are illustrative and not limitative. Other modifications and variations will be apparent to those skilled in the art and are intended to fall within the scope of the appended claims.

While various embodiments of present invention have been described, it will be apparent to those of skill in the art that many more embodiments and implementations are possible that are within the scope of this invention. Accordingly, the present invention is not to be restricted except in light of the attached claims and their equivalents.

What is claimed is:

1. A method of debugging a simulation system comprising design code representing a design of an electronic circuit and test program code configured to exercise the design code, the method comprising:
    using a first debugging tool, executing a first simulation of the test program code and the design code, to generate first simulation results, wherein the first simulation results comprise a plurality of signal values generated by the first simulation;
    using the first debugging tool, storing information of the first simulation result a first dump file;
    using an interactive debugging tool, executing an interactive simulation of the test program code and the design code to generate interactive simulation results, wherein the interactive simulation results comprise a plurality of signal values generated by the interactive simulation, wherein the interactive debugging tool is different from the first debugging tool;
    using the interactive debugging tool, storing the interactive simulation results to a second dump file, wherein the first dump file is separate from the second dump file; and
    during the interactive simulation, displaying, using the interactive debugging tool, information from the first dump file.

2. The method of claim 1, wherein the information from the first dump file is displayed while the interactive simulation is suspended at an interactive simulation time.

3. The method of claim 2, wherein the displayed information represents a signal value for a simulation time after the interactive simulation time.

4. The method of claim 1, further comprising:
    displaying, using the interactive debugging tool, information from the second dump file.

5. The method of claim 4, wherein the displayed information from the first dump file represents a signal value for a simulation time after the interactive simulation time, and wherein the displayed information from the second dump file represents a signal value for a simulation time before the interactive simulation time.

6. The method of claim 4, further comprising:
    receiving a request for information of signal value;
    determining that the request may be satisfied by information stored in either of:
        the the first dump file; and
        the second dump file;
    automatically selecting information from the first dump file or the second dump file; and
    display information accessed from the selected file.

7. The method of claim 6, wherein the selected file is selected without regard to the information being available in from the first dump file.

8. A computer system adapted to debug a simulation system comprising design code representing a design of an electronic circuit and test program code configured to exercise the design code, the computer system configured to:
    using a first debugging tool, execute a first simulation of the test program code and the design code, to generate first simulation results, wherein the first simulation results comprise a plurality of signal values generated by the first simulation;
    using the first debugging tool, store information of the first simulation result a first dump file;
    using an interactive debugging tool, execute an interactive simulation of the test program code and the design code to generate interactive simulation results, wherein the interactive simulation results comprise a plurality of signal values generated by the interactive simulation;
    using the interactive debugging tool, store the interactive simulation results to a second dump file, wherein the first dump file is separate from the second dump file; and
    during the interactive simulation, display, using the interactive debugging tool, information from the first dump file.

9. The computer system of claim 8, wherein the information from the first dump file is displayed while the interactive simulation is suspended at an interactive simulation time.

10. The computer system of claim 9, wherein the displayed information represents a signal value for a simulation time after the interactive simulation time.

11. The computer system of claim 8, further configured to:
    display, using the interactive debugging tool, information from the second dump file.

12. The computer system of claim 11, wherein the displayed information from the first dump file represents a signal value for a simulation time after the interactive simulation time, and wherein the displayed information from the second dump file represents a signal value for a simulation time before the interactive simulation time.

13. The computer system of claim 11, further configured to:
   receive a request for information of signal value;
   determine that the request may be satisfied by information stored in either of:
      the the first dump file; and
      the second dump file;
   automatically select information from the first dump file or the second dump file; and
   display information accessed from the selected file.

14. The computer system of claim 13, wherein the selected file is selected without regard to the information being available in from the first dump file.

* * * * *